United States Patent
Huang et al.

(10) Patent No.: US 10,340,615 B2
(45) Date of Patent: Jul. 2, 2019

(54) ALTITUDE INCREASING CONNECTOR AND METHOD FOR MANUFACTURING THE SAME

(71) Applicant: Tarng Yu Enterprise co., ltd., New Taipei (TW)

(72) Inventors: Mu-Jung Huang, New Taipei (TW); Ying-Chung Chen, New Taipei (TW)

(73) Assignee: TARNG YU ENTERPRISE CO., LTD., New Taipei (TW)

( * ) Notice: Subject to any disclaimer, the term of this patent is extended or adjusted under 35 U.S.C. 154(b) by 0 days.

(21) Appl. No.: 15/913,494

(22) Filed: Mar. 6, 2018

(65) Prior Publication Data
US 2018/0261935 A1    Sep. 13, 2018

(30) Foreign Application Priority Data

Mar. 10, 2017    (TW) .............................. 106107927 A
Dec. 15, 2017    (TW) .............................. 106144277 A

(51) Int. Cl.
| | |
|---|---|
| *H01R 13/02* | (2006.01) |
| *H01R 13/28* | (2006.01) |
| *H01R 13/40* | (2006.01) |
| *H01R 12/57* | (2011.01) |
| *H05K 1/18* | (2006.01) |
| *H01R 43/20* | (2006.01) |
| *H01R 13/415* | (2006.01) |

(52) U.S. Cl.
CPC ........... *H01R 12/57* (2013.01); *H01R 13/415* (2013.01); *H01R 43/20* (2013.01); *H05K 1/181* (2013.01); *H05K 2201/10151* (2013.01); *H05K 2201/10378* (2013.01); *H05K 2201/10757* (2013.01); *H05K 2201/10939* (2013.01)

(58) Field of Classification Search
CPC ........ H01R 13/02; H01R 13/28; H01R 13/40; H01R 43/20; H01R 43/24; H01R 43/78; H01L 21/48; H01L 21/78; H01L 23/00; H01L 23/12; H01L 23/48; H01L 23/52; H05K 7/02; H05K 7/06
USPC ............ 174/262, 50, 252, 260; 439/74, 660; 257/676, 778; 358/509
See application file for complete search history.

(56) References Cited

U.S. PATENT DOCUMENTS

| | | | |
|---|---|---|---|
| 4,971,565 A * | 11/1990 | Fox, Jr. .................. | H01R 12/57 439/295 |
| 6,010,370 A * | 1/2000 | Aihara .............. | B29C 45/14639 29/883 |

(Continued)

*Primary Examiner* — Xiaoliang Chen
(74) *Attorney, Agent, or Firm* — Chung-Ming Shih

(57) ABSTRACT

An altitude increasing connector and the method for manufacturing the same for an electrical connection of a sensor element and a circuit substrate inside a portable electronic device, such that the sensor element is altitude increased, thereby an appropriate disposition altitude of the sensor element is adjusted, in order to ensure normal function of the sensor element, so that the yield of the portable electronic device is increased. The altitude increasing connector has a plurality of conductive terminals, each of which has a first welding pad for welding the sensor element and a second welding pad for welding the circuit substrate, wherein a distance between welding surfaces of both the first, second welding pads of each conductive terminal is fixed, such that a relative distance between electrical joints of both the sensor element and the circuit substrate is fixed.

10 Claims, 14 Drawing Sheets

(56) References Cited

U.S. PATENT DOCUMENTS

| | | | | |
|---|---|---|---|---|
| 7,671,459 B2* | 3/2010 | Corisis | H01L 21/561 | 257/686 |
| 2002/0057468 A1* | 5/2002 | Segawa | H01L 27/14618 | 358/509 |
| 2002/0141123 A1* | 10/2002 | Bishop | G02F 1/133615 | 361/66 |
| 2002/0179315 A1* | 12/2002 | Brown | H02G 3/088 | 174/50 |
| 2004/0173891 A1* | 9/2004 | Imai | H01L 23/49827 | 257/686 |
| 2004/0184219 A1* | 9/2004 | Otsuka | H01L 23/49805 | 361/306.3 |
| 2005/0023033 A1* | 2/2005 | Saiki | H01L 23/49827 | 174/260 |
| 2005/0236708 A1* | 10/2005 | Farnworth | H01L 27/14618 | 257/723 |
| 2005/0275049 A1* | 12/2005 | Kirby | H01L 21/76898 | 257/433 |
| 2005/0285154 A1* | 12/2005 | Akram | H01L 21/76898 | 257/234 |
| 2006/0001179 A1* | 1/2006 | Fukase | H01L 23/14 | 257/778 |
| 2008/0048316 A1* | 2/2008 | Roberts | H01L 23/3121 | 257/737 |
| 2008/0227316 A1* | 9/2008 | Ju | H01R 12/712 | 439/133 |
| 2011/0080515 A1* | 4/2011 | Kang | H01L 27/14618 | 348/374 |
| 2012/0098123 A1* | 4/2012 | Yu | H01L 21/563 | 257/737 |
| 2012/0295484 A1* | 11/2012 | Sato | H01R 13/22 | 439/626 |
| 2014/0362552 A1* | 12/2014 | Murayama | H05K 1/0203 | 361/783 |
| 2015/0137338 A1* | 5/2015 | Lin | H01L 23/49816 | 257/676 |
| 2016/0344118 A1* | 11/2016 | Hsieh | H01R 43/16 | |
| 2017/0081177 A1* | 3/2017 | Neul | B81B 7/0048 | |
| 2017/0194721 A1* | 7/2017 | Fan | H01R 4/04 | |

* cited by examiner

ALTITUDE INCREASING CONNECTOR AND METHOD FOR MANUFACTURING THE SAME

CROSS-REFERENCE TO RELATED APPLICATIONS

This application claims the priority of Taiwan Patent Application No. (106107927 and 106144277) filed on (Mar. 10, 2017 and Dec. 15, 2017, the disclosure of which is incorporated herein by reference.

BACKGROUND OF THE INVENTION

Field of the Invention

The invention is related to the technical field of connector, particularly to an altitude increasing connector capable of mounting sensor elements of a portable electronic device at an appropriate altitude and the method for manufacturing the same.

Descriptions of the Related Art

In recent years, with rapid development of video and audio functions of portable electronic devices, functional requirements are increased day after day for audio and video systems in the portable electronic devices, so that a portable electronic device usually has various sensor elements disposed therein, by which external messages, such as acoustic or light source, where the sensor elements are disposed are sensed, such that the portable electronic device can implement required video and audio functions.

Sensor elements (e.g., light, acoustic sensor elements) disposed on current portable electronic devices would usually be disposed in limited spaces inside the portable electronic devices. Since the sensor elements are disposed at inadequate disposition altitudes, there would be adverse impact on results of sensing external environment for the sensor elements, and even more, there would be impact on electrical connections of the sensor elements and a circuit substrate. Therefore, members have to be added on the portable electronic devices for the sensor elements, such that the disposition altitudes of the sensor elements are adequate. Specially, the appropriate disposition altitudes of the sensor elements are adjusted through adding the members on the portable electronic devices. The added members are usually formed of a plurality of stacked circuit boards.

However, the circuit boards are subject to thermal expansion and cold contraction issues, size errors of the circuit boards themselves are large, and size errors would be enlarged due to accumulation after stacking the plurality of circuit boards, such that the disposition altitudes of the sensor elements cannot be adjusted to appropriate values by adding the members, so that the sensor elements cannot function as expected. In addition, multiple processes have to be completed separately for stacking the plurality of circuit boards, so that a cumbersome processing procedure would be resulted and high cost of adding the members remains.

In consequence, relevant vendors in the industry desire to understand how to provide members for sensor elements of portable electronic devices to be mounted at appropriate altitudes.

SUMMARY OF THE INVENTION

In view of the above and other drawbacks of the conventional technology, a primary object of the invention is to provide an altitude increasing connector for embedding a plurality of conductive terminals in a connector body by way of insert modeling, such that size precision and structural strength of the altitude increasing connector are as expected. Two ends of each of the conductive terminals are exposed to two surfaces of the connector body separately for welding sensor elements and a circuit substrate inside a portable electronic device, allowing the sensor elements to be altitude increased on the circuit substrate.

Another object of the invention is to provide an altitude increasing connector having a plurality of conductive terminals arranged in two symmetric rows, a left and a right rows. Two ends of each of the conductive terminals are bent to result in a first welding pad and a second welding pad, which are exposed to two surfaces of the connector body separately for welding a sensor element and a circuit substrate inside a portable electronic device, allowing the sensor element to be altitude increased on the circuit substrate. Since the first, second welding pads are formed by bending the conductive terminal integrally, the attenuation level for signal transmitted on the conductive terminal between the sensor element and the circuit substrate may be reduced.

For the objects said above and for other objects, the invention provides an altitude increasing connector for an electrical connection of a sensor element and a circuit substrate inside a portable electronic device, such that a relative distance between electrical joints of both the sensor element and the circuit substrate is fixed to a first distance, by which the sensor element is altitude increased, the altitude increasing connector including: a connector body respectively having a first outer surface corresponding to the sensor element, and a second outer surface corresponding to the circuit substrate, wherein the first, second outer surfaces are two outer surfaces opposite to each other; and a plurality of conductive terminals, which pass through the connector body separately, and are formed with a first welding pad and a second welding pad separately; the first, second welding pads of each of the plurality of conductive terminals being formed through bend separately, and being exposed to the first, second outer surfaces separately, in order for welding the sensor element and the circuit substrate separately, allowing the sensor element to be altitude increased by the first distance, wherein a distance between welding surfaces of both the first, second welding pads is a second distance, which is substantially the same as the first distance.

Preferably, the plurality of conductive terminals are arranged in two symmetric rows, a left and a right rows.

Preferably, the plurality of conductive terminals which are arranged in the left row are bent in a first direction, the plurality of conductive terminals which are arranged in the right row are bent in a second direction, the first, second directions being two opposite directions.

Preferably, the connector body is an insulator.

Preferably, each of the plurality of conductive terminals is formed by bending a sheet metal integrally.

Preferably, each of the first, second welding pads is protruded out of the first, second outer surfaces of the connector body separately.

Preferably, each of the plurality of conductive terminals is bent continuously to form an approximate inverted U shape.

Preferably, the connector body has a plurality of locating slots, each of which is used to locate the plurality of conductive terminals in forming the connector body.

Preferably, at least two of the locating slots have vertically orthogonal relationship.

Preferably, the sensor element is a light sensor element or an acoustic sensor element.

The invention further provides an altitude increasing connector for an electrical connection of a sensor element and a circuit substrate inside a portable electronic device, such that a relative distance between electrical joints of both the sensor element and the circuit substrate is fixed to a first distance, by which the sensor element is altitude increased, the altitude increasing connector including: a connector body respectively having a first outer surface corresponding to the sensor element, and a second outer surface corresponding to the circuit substrate, wherein the first, second outer surfaces are two outer surfaces opposite to each other; and a plurality of conductive terminals, each of which has a first welding pad and a second welding pad separately, passes through the connector body, and exposes the first, second welding pads on the first, second outer surfaces separately, wherein the first welding pad is used to weld the sensor element, the second welding pad is used to weld the circuit substrate, such that the sensor element is altitude increased by the first distance, wherein a distance between welding surfaces of both the first, second welding pads is a second distance, which is substantially the same as the first distance.

The invention further provides an altitude increasing connector for an electrical connection of a sensor element and a circuit substrate inside a portable electronic device, such that a relative distance between electrical joints of both the sensor element and the circuit substrate is fixed to a first distance, by which the sensor element is altitude increased, the altitude increasing connector including: a connector body respectively having a plurality of rectangular through-holes, a first outer surface corresponding to the sensor element, and a second outer surface corresponding to the circuit substrate, wherein the first, second outer surfaces are two outer surfaces opposite to each other; and a plurality of conductive terminals formed by trimming a conductive wire, on which each cross section is rectangular, each of the conductive terminals passing through the connector body via one of the plurality of rectangular through-holes in sequence to be exposed to the first, second outer surfaces separately, as well as a plurality of first welding pads for welding the sensor element being formed on the first outer surface, and a plurality of second welding pads for welding the circuit substrate being formed on the second outer surface, wherein a distance between welding surfaces of both the first, second welding pads is a second distance, which is substantially the same as the first distance.

The invention further provides a method for manufacturing an altitude increasing connector, which is capable of an electrical connection of a sensor element and a circuit substrate inside a portable electronic device, such that a relative distance between electrical joints of both the sensor element and the circuit substrate is fixed to a first distance, by which the sensor element is altitude increased, the method for manufacturing the altitude increasing connector including the following steps: providing a conductive wire, on which each cross section is rectangular; providing a connector body respectively having a first rectangular through-hole, a second rectangular through-hole, a first outer surface corresponding to the sensor element, and a second outer surface corresponding to the circuit substrate, wherein the first, second outer surfaces are two outer surfaces opposite to each other; trimming the conductive wire to form a first conductive terminal before causing the first conductive terminal to pass through the connector body via the first rectangular through-hole, followed by causing the second conductive terminal to pass through the connector body via the second rectangular through-hole, wherein the first, second conductive terminals can be exposed to the first outer surface for welding a first welding pad of the sensor element, and exposed to the second outer surface for welding a second welding pad of the circuit substrate separately, wherein a distance between the first welding pad and the second welding pad is a second distance, which is substantially the same as the first distance.

Preferably, each of the first, second welding pads is formed through an bend operation before or after the first, second conductive terminals pass through the connector body via the first, second rectangular through-holes separately.

In comparison to prior arts, the invention is related to an altitude increasing connector and the method for manufacturing the same for an electrical connection of a sensor element and a circuit substrate inside a portable electronic device. The altitude increasing connector according to the invention includes a connector body and a plurality of conductive terminals, which pass through the connector body as well as have a first welding pad for welding the sensor element and a second welding pad for welding the circuit substrate separately, wherein a distance between welding surfaces of both the first, second welding pads is fixed, such that a relative distance between electrical joints of both the sensor element and the circuit substrate is fixed, in order for adjusting the sensor element to an appropriate disposition altitude by one process, so that not only manufacturing process efficient is improved, but also error accumulation may be avoided, increasing yield of a portable electronic device.

DETAILED DESCRIPTION OF THE PREFERRED EMBODIMENT

Exemplary descriptions for main features and effects of the invention are illustrated in conjunction with FIGS. 1 to 14 below.

Figure 5:
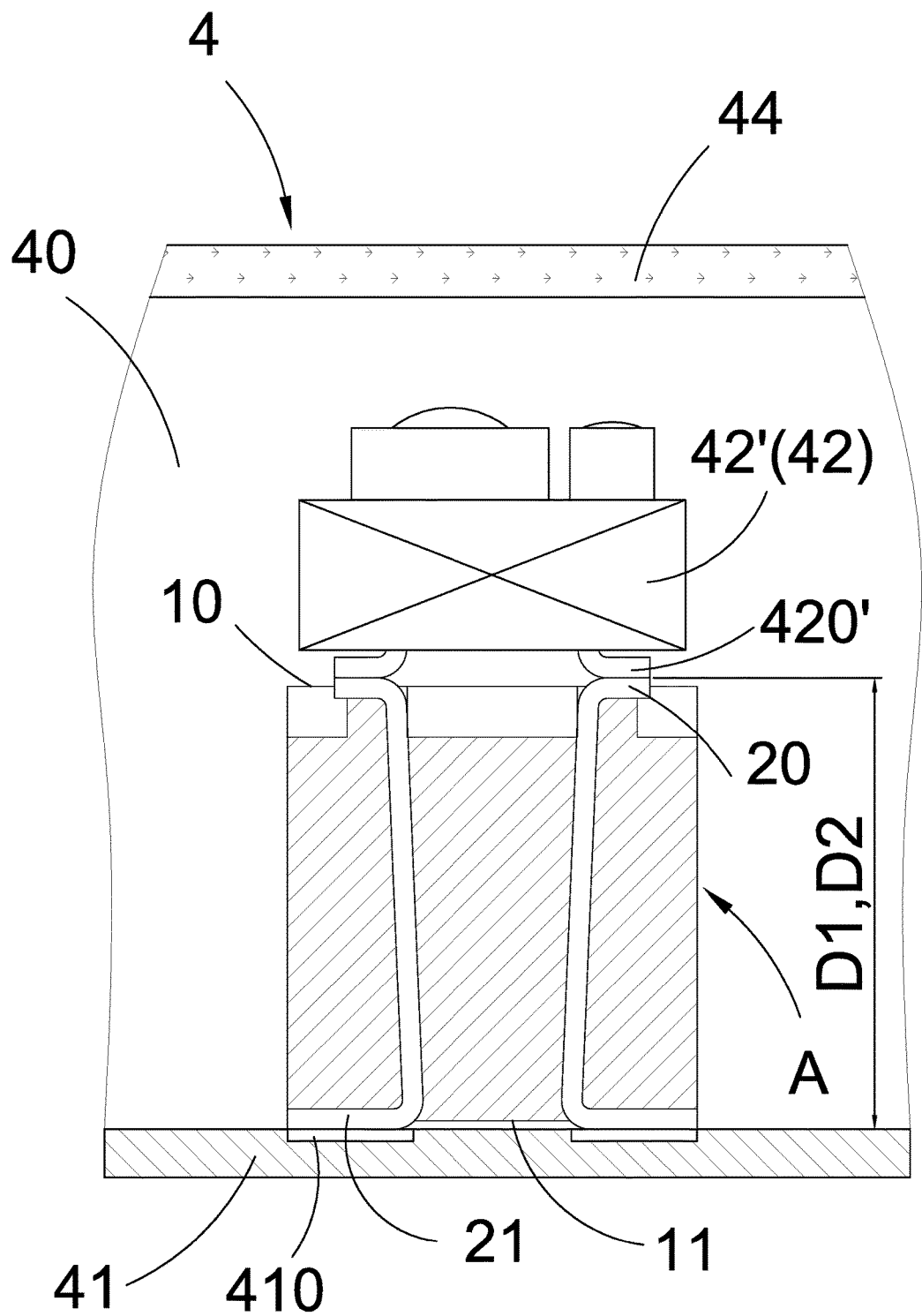
FIG. 5 is a schematic view showing an altitude increasing connector according to the invention applied to increase altitude for a light sensor element of a phone.
Figure 6:
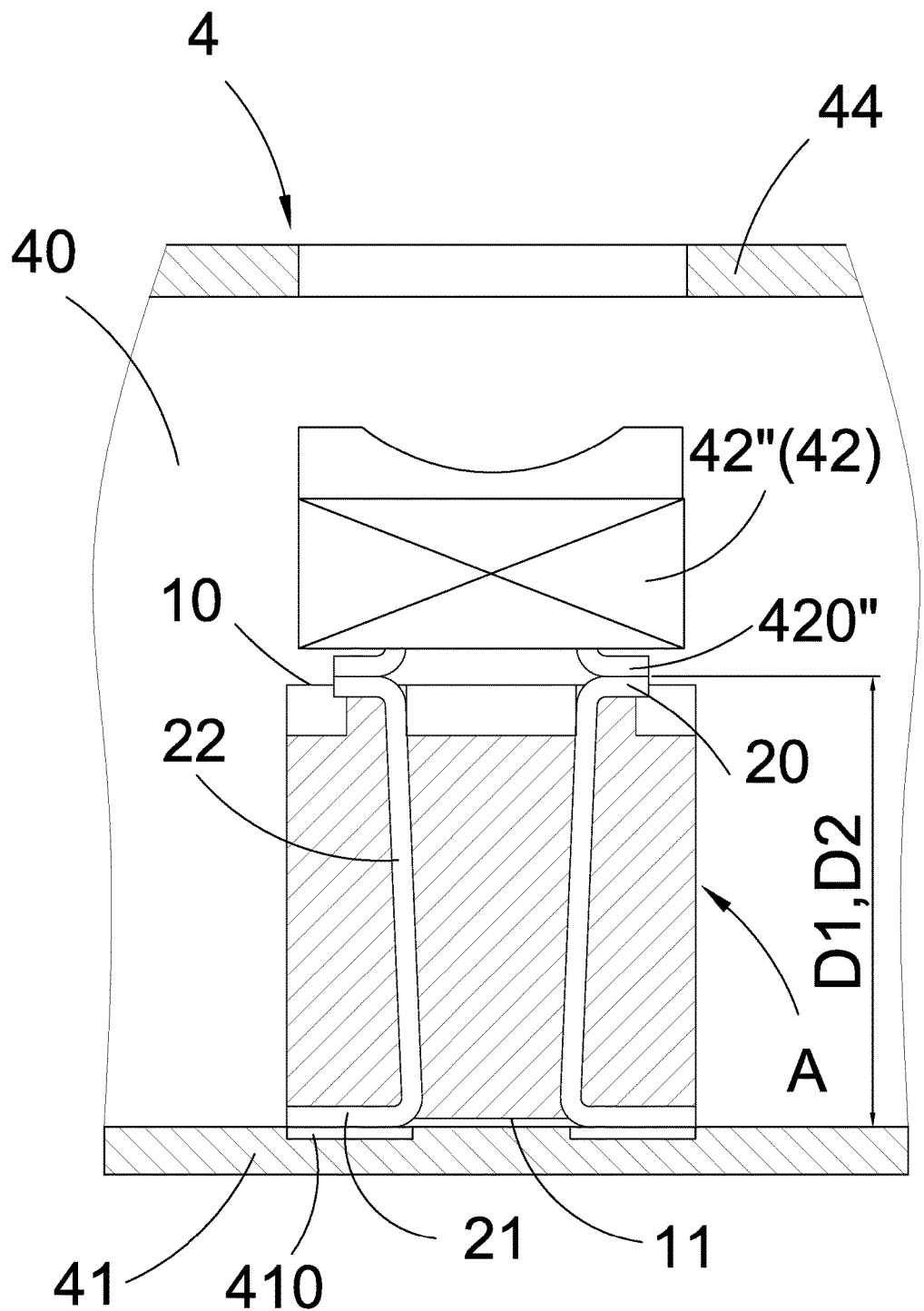
FIG. 6 is a schematic view showing an altitude increasing connector according to the invention applied to increase altitude for an acoustic sensor element of a phone.

An altitude increasing connector A according to the invention comprises a connector body 1 and a plurality of conductive terminals 2. As shown in FIGS. 5 and 6, The altitude increasing connector A is used for increasing altitude of a sensor element 42 to achieve an electrical connection of the sensor element 42 and a circuit substrate 41 inside a portable electronic device. More specially, a relative distance between electrical joints of both the sensor element 42 and the circuit substrate 41 is fixed to a first distance D1, allowing the sensor element 42 to be altitude increased by the first distance D1, such that a disposition altitude of the sensor element 42 in the portable electronic device is appropriate, so that required functions are provided in the portable electronic device.

Figure 1:
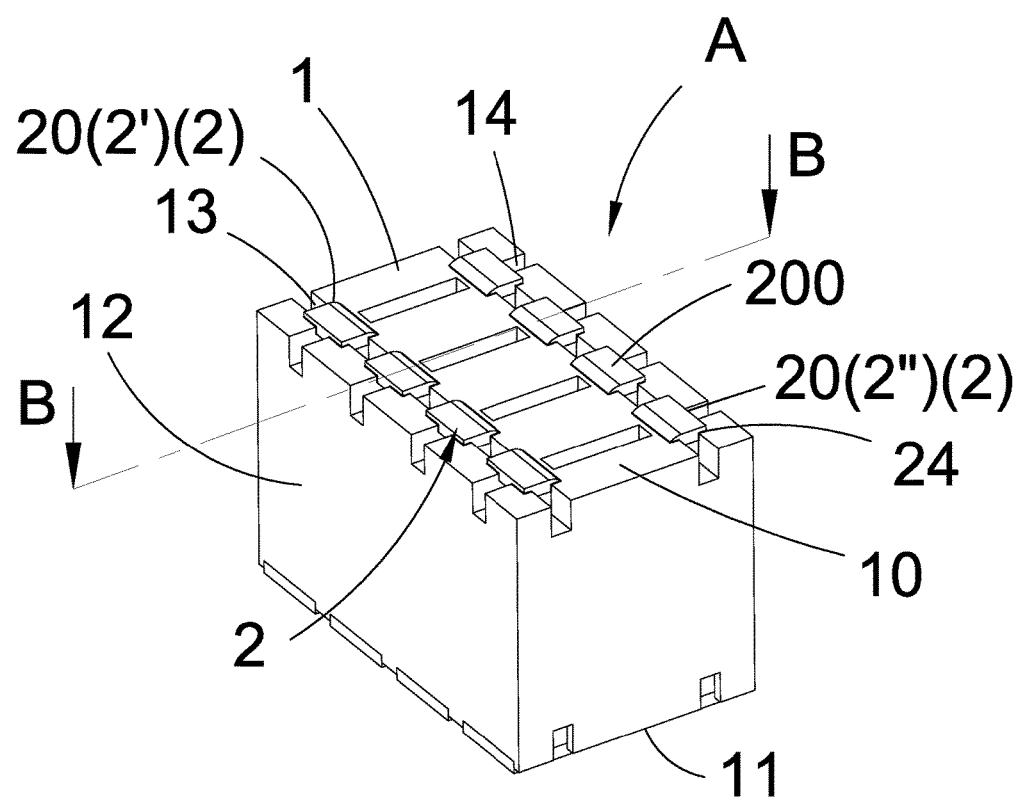
FIG. 1 is a stereo appearance view showing a first example of an altitude increasing connector according to the invention.
Figure 2:
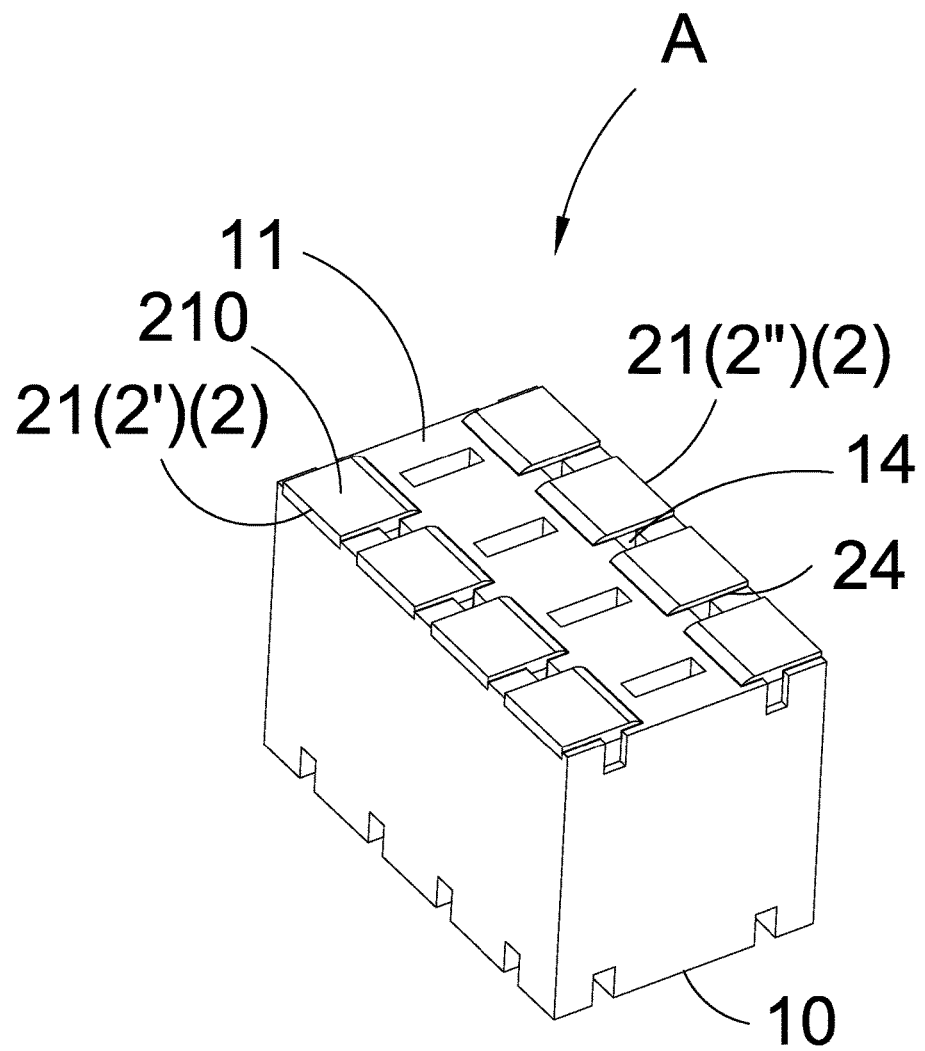
FIG. 2 is a stereo appearance view showing the first example of the altitude increasing connector according to the invention from another angle.
Figure 3:
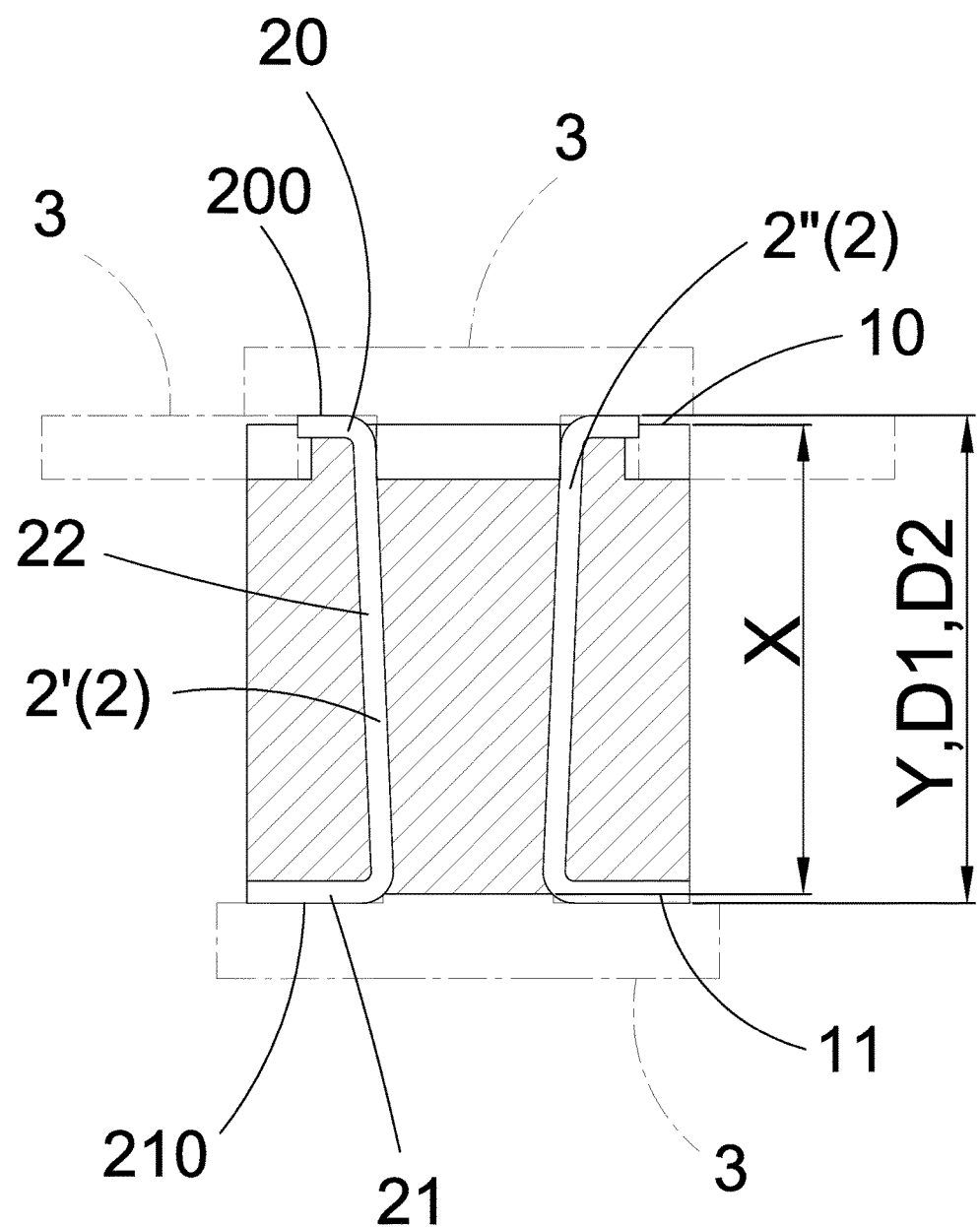
FIG. 3 is a sectional view showing the altitude increasing connector shown in FIG. 1 taken along line BB.

As shown in FIGS. 1 to 3, the connector body 1 is made from an insulating material and an external contour is a rectangular column, which has a first outer surface 10, a second outer surface 11 and an outer lateral surface 12, wherein the first, second outer surfaces 10, 11 are disposed on two outer surfaces opposite to each other on the connector body 1 and are vertical to the outer lateral surface 12 separately.

Figure 4:
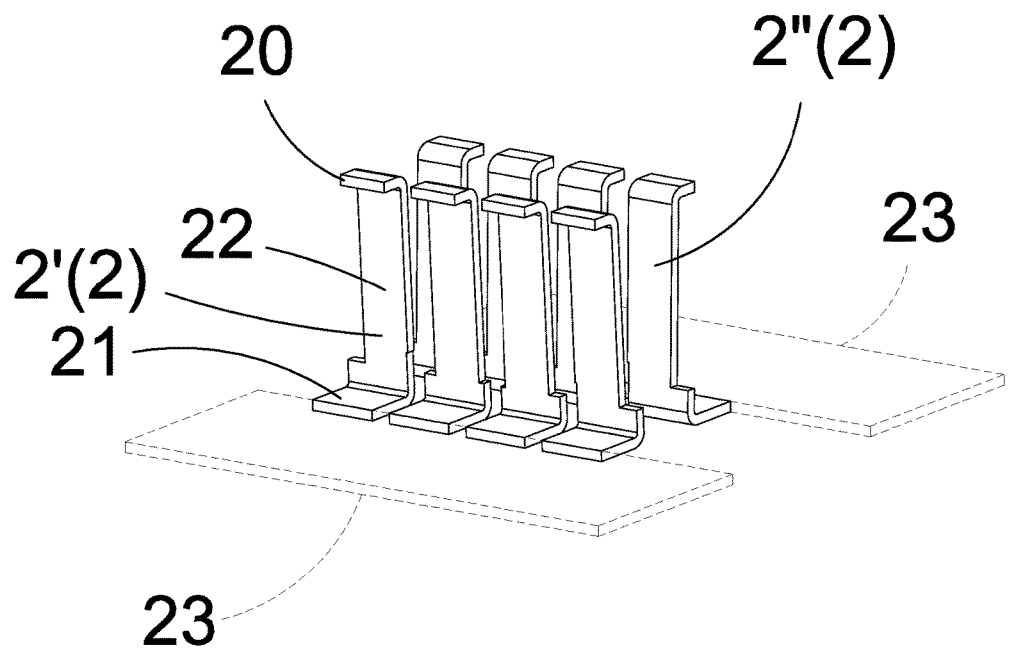
FIG. 4 is a schematic view showing conductive terminals of an altitude increasing connector carried on strips.

Each of the conductive terminals 2 passes through the connector body 1 and is exposed to the first, second outer surfaces 10, 11 separately. As shown in FIG. 4, each of the conductive terminals 2 has a first welding pad 20, a second welding pad 21 and a securing section 22. Moreover, during manufacturing the altitude increasing connector according to the invention, optionally, each conductive terminal 2 may be formed by bending a sheet metal integrally, and be secured through a metal sheet like strip 23 when combining with the connector body 1.

As shown in FIGS. 1 to 2, each conductive terminal 2 is bent to form the first welding pad 20 on the first outer surface, and to form the second welding pad 21 on the second outer surface 11, wherein the first welding pad 20 is provided with a first welding surface 200, the second welding pad 21 is provided with a second welding surface 210, and sizes or shapes of the first, second welding pads 20, 21 may be the same or different optionally. The securing section 22 is embedded in the connector body 1, such that the connector body 1 may secure each of the conductive terminals 2 through the securing section 22, so that shift of each of the conductive terminals 2 is avoided.

The first, second welding pads 20, 21 of each conductive terminal 2 are exposed and protruded out of the first, second outer surfaces 10, 11 separately, and peripheral sides 24 of the first, second welding pads 20, 21 are buried in the connector body 1 separately, such that the connector body 1 can provide support for the first, second welding pads 20, 21 firmly.

As shown in FIG. 3, a distance between both the first, second outer surfaces 10, 11 is a body formation height X of the connector body 1. The securing section 22 connects the first welding pad 20 and the second welding pad 21, such that a distance between both the first, second welding surfaces 200, 210 is a terminal formation height Y of the conductive terminal 2, wherein the terminal formation height Y is greater than or equivalent to the body formation height X, in order to ensure that the first, second welding surfaces 200, 210 can weld the sensor element and the circuit substrate inside the portable electronic device separately.

As shown in FIG. 5, the altitude increasing connector A according to the invention may be provided in an accommodation space 40 of a housing shell 44 of a phone 4. Moreover, the accommodation space 40 is provided with the circuit substrate 41 and a light sensor element 42' therein. The first welding pad 20 of the altitude increasing connector A is used to weld a welding foot 420' of the light sensor element 42'. The second welding pad 21 of the altitude increasing connector A is used to weld a metal contact 410 of a circuit substrate 41. By adjusting the terminal formation height Y of the altitude increasing connector A, the light sensor element 42' is altitude increased and can be located at a preset altitude exactly.

Furthermore, the body formation height X of the altitude increasing connector A is less than the terminal formation height Y of the altitude increasing connector A, such that the first welding pad 20 can weld the welding foot 420' of the light sensor element 42', and the second welding pad 21 can weld the metal contact 410 of the circuit substrate 41. Therefore, the connector body 1 may provide support for the plurality of conductive terminals 2, such that the light sensor element 42' can be located at an appropriate altitude in the accommodation space 40 of the phone 4 for adjusting brightness of a screen of the phone 4, or providing a sensing function which controls when to turn on/off an auxiliary light source in taking photos or photographing.

It is also noted that a distance between electrical joints of both the light sensor element 42' and the circuit substrate 41 is a first distance D1, and a distance between welding surfaces of each of the first welding pads 20 and each of the second welding pads 21 is a second distance D2, which is essentially the same as the first distance D1. As such, the first distance D1 (i.e., the second distance D2) may be increased for the light sensor element 42' to achieve an electrical connection of both the light sensor element 42' and the circuit substrate 41 inside the portable electronic device.

As shown in FIG. 6, the altitude increasing connector A according to the invention may be provided in the accommodation space 40 of the housing shell 44 of the phone 4. Moreover, the accommodation space 40 is provided with the circuit substrate 41 and an acoustic sensor element 42" therein. The first welding pad 20 of the altitude increasing connector A is used to weld a welding foot 420" of the acoustic sensor element 42". The second welding pad 21 of the altitude increasing connector A is used to weld the metal contact 410 of a circuit substrate 41. By adjusting the terminal formation height Y of the altitude increasing connector A, the acoustic sensor element 42" is altitude increased and can be located at a preset altitude exactly.

Furthermore, the body formation height X of the altitude increasing connector A is less than the terminal formation height Y of the altitude increasing connector A, such that the first welding pad 20 can weld the welding foot 420" of the acoustic sensor element 42" in correspondence, and the second welding pad 21 can weld the metal contact 410 of the circuit substrate 41. Therefore, the connector body 1 may provide support for the plurality of conductive terminals 2, such that the acoustic sensor element 42' can be located at an appropriate altitude in the accommodation space 40 of the phone 4 for providing a sensing function when adjusting sound of the phone 4.

In an example of the invention, each conductive terminal 2 is formed through stamping for the first, second welding pads 20, 21 of the conductive terminal 2 to be bent in the same direction and formed with a shape having an inverted U appearance by continuous bend. After being subject to stamping and being formed, each of the conductive terminals 2 may be placed in a formation mold of the connector body 1, and arranged in a single row or divided into two symmetric rows, a left and a right rows, in order for completing combination of the connector body 1 and each of the conductive terminals 2 through one-time operation to form the altitude increasing connector according to the invention. As such, the effectiveness of saving production cost and improving manufacturing process efficiency may be achieved, and error with respect to size of the altitude increasing connector due to multiple operations may be avoided, in order to improve and increase yield of the altitude increasing connector product.

As shown in FIG. 4, the conductive terminals 2 are arranged in two symmetric rows, a left and a right rows, wherein the conductive terminals 2 which are arranged in the left row are bent in a first direction to form the first, second welding pads 20, 21 separately, the conductive terminals 2 which are arranged in the right row are bent in a second direction to form the first, second welding pads 20, 21 separately. The first, second directions are two opposite directions.

It is to be noted that the first, second welding pads 20, 12 of the conductive terminal 2 may also be formed through a non-stamping approach, such as molding, forging etc., such that the first, second welding pads 20, 12 of the conductive terminal 2 are extended away from the securing section 22 in the same direction to form the conductive terminal 2 with a shape having an inverted U appearance.

Furthermore, a formation mold (not shown) of the connector body 1 is used for providing resin or plastics to cover the securing sections 22 of the conductive terminals 2, and the formation mold has to locate the conductive terminals 2 through locating pieces 3 before forming the connector body 1, in order to prevent the conductive terminals 2 from failed locating at predetermined locations due to location shift resulted from fluid pressure in the formation mold, which results in location error.

For this, as shown in FIGS. 1 to 2, the connector body 1 is disposed with a first locating slot 13 and a second locating slot 14, which have vertically orthogonal relationship, on the first, second outer surfaces 10, 11. The locating pieces 3 are provided between both the first, second locating slots 13, 14 to locate the conductive terminals 2 separately in forming the connector body 1. After the connector body 1 of the altitude increasing connector A has covered (combined) the conductive terminals 2, the locating pieces 3 may be removed from the first, second locating slots 13, 14 separately to complete manufacture of the altitude increasing connector A.

Additionally, as shown in FIGS. 7 to 10, in the invention, the conductive terminal 2 may also be formed by trimming a conductive wire 5 to avoid error accumulation with respect to size due to multiple processing operations for the conductive terminal 2, so that the terminal formation height Y of the conductive terminal 2 can be as expected, and the sensor element 42 is adjusted to an appropriate altitude for completing the electrical connection of the sensor element 42 and the circuit substrate 41 smoothly. In other words, the connector body 1 has a plurality of rectangular through-holes 15. Each of the conductive terminals 2 is formed by trimming the conductive wire 5 with a rectangular cross section. Each conductive terminal 2 passes through the connector body 1 via one of the plurality of rectangular through-holes 15 in sequence to be exposed to the first, second outer surfaces 10, 11 separately, and the first welding pad for welding the sensor element 42 is formed on the first outer surface 10, while the second welding pad 21 for welding the circuit substrate 41 is formed on the second outer surface 11.

Figure 7:
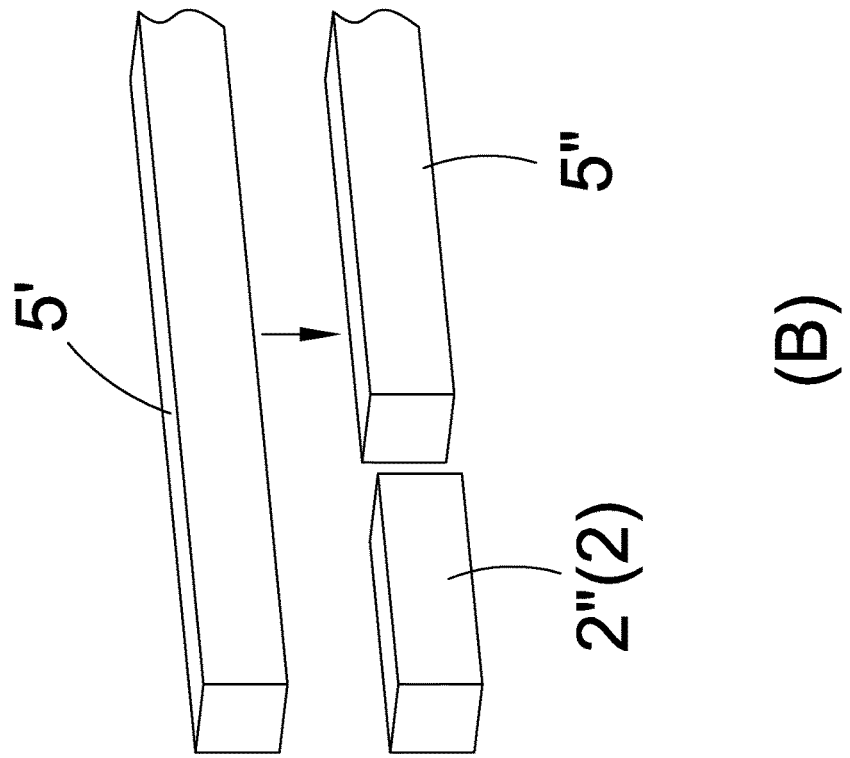
FIG. 7 is a schematic view showing a conductive terminal formed by trimming a conductive wire.
Figure 7:
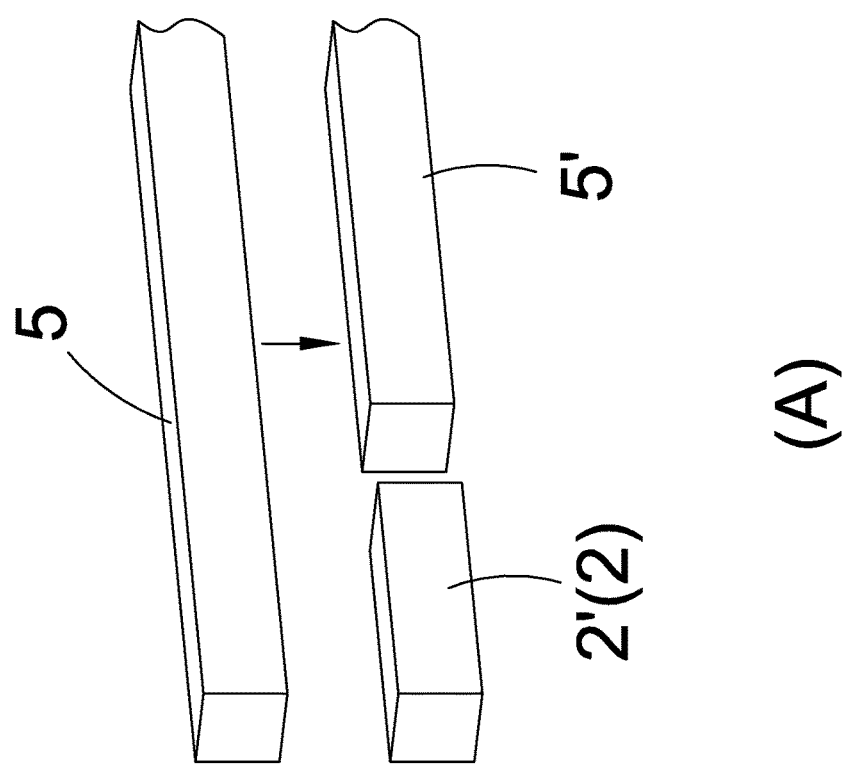
Figure 8:
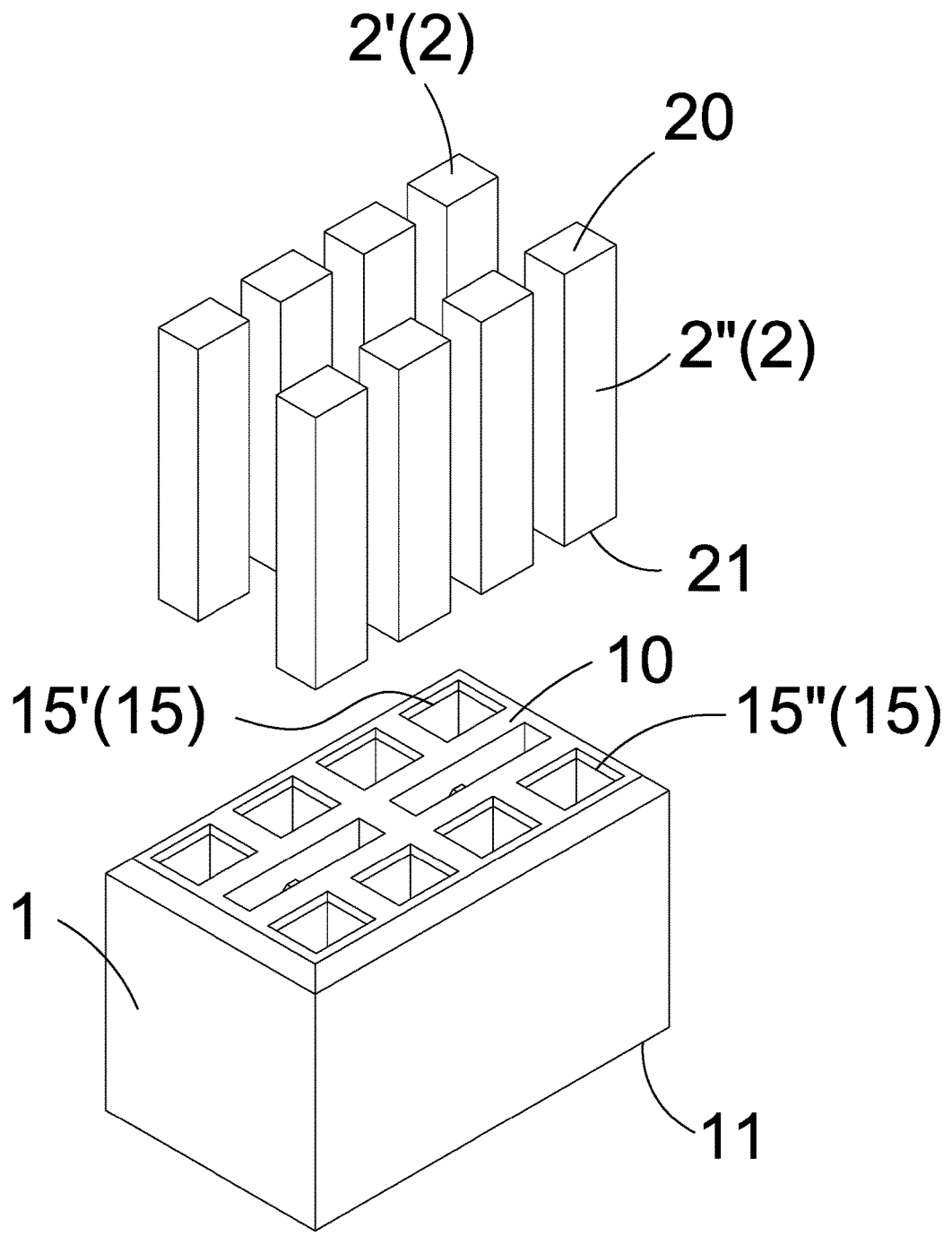
FIG. 8 is an exploded view of members showing a second example of an altitude increasing connector according to the invention.
Figure 9:
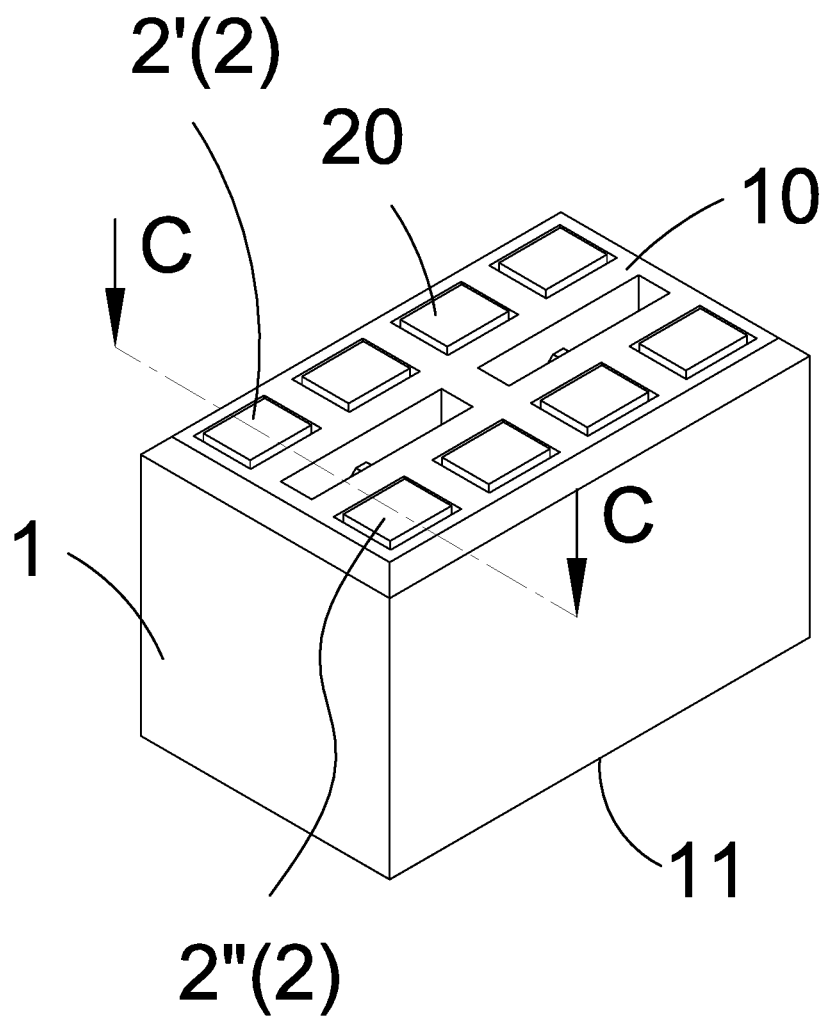
FIG. 9 is an assembly view of members showing the second example of the altitude increasing connector according to the invention.
Figure 10:
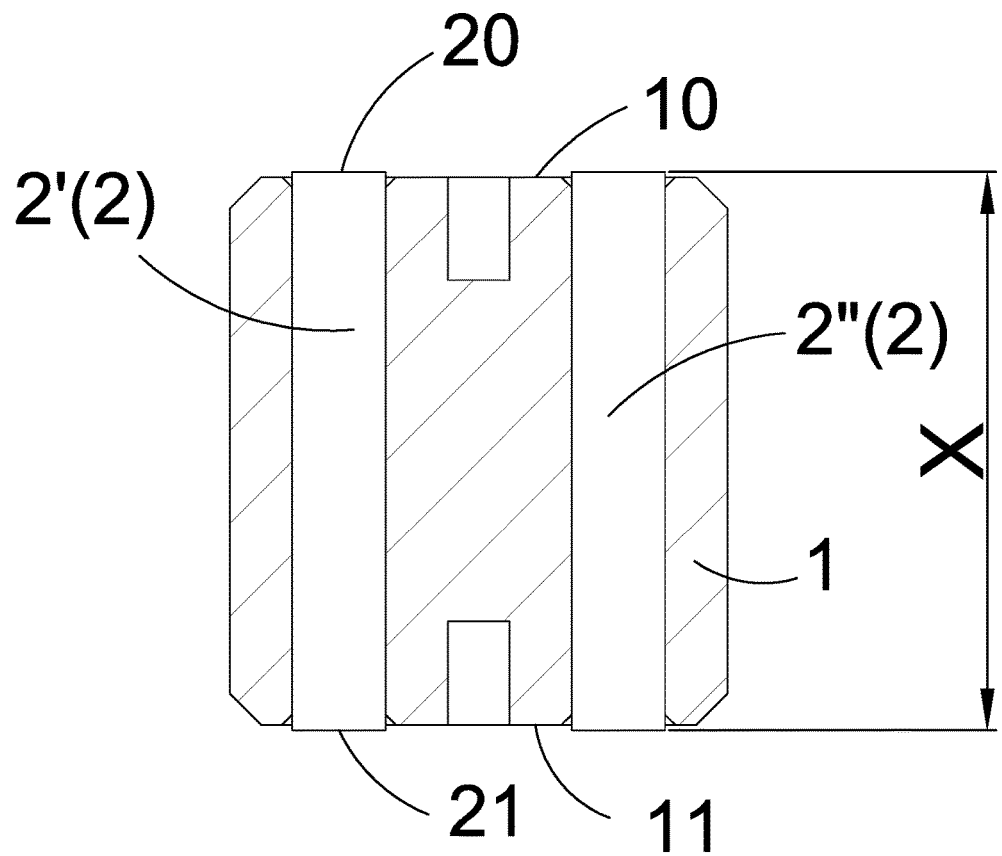
FIG. 10 is a sectional view showing the altitude increasing connector shown in FIG. 9 taken along line CC.
Figure 14:
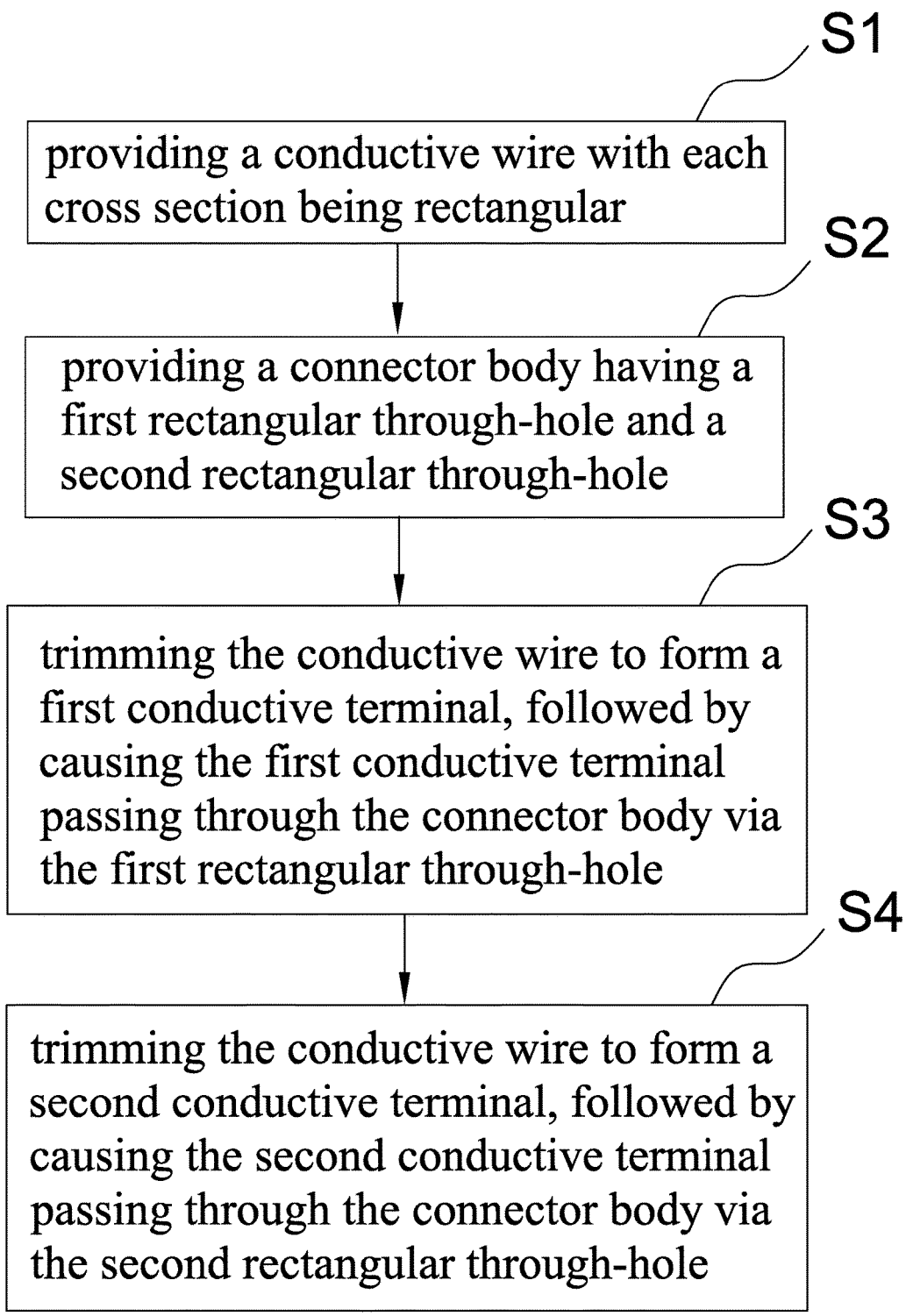
FIG. 14 is a manufacture flow chart for the second example of the altitude increasing connector according to the invention.

Therefore, the following manufacture method disclosed in FIG. 14 for the altitude increasing connector according to the invention is used: in step S1, a conductive wire 5 with each cross section being rectangular is provided; in step S2, the connector body 1 having the first, second rectangular through-holes 15', 15" is provided; in step S3, as shown in portion (A) of FIG. 7, the conductive wire 5 is trimmed to form the first conductive terminal 2' and a remained conductive wire 5' after trimming the conductive wire 5, followed by, as shown in FIG. 8, causing the first conductive terminal 2' to pass through the connector body 1 via the first rectangular through-hole 15', as shown in FIGS. 9 to 10, to be exposed to the first second outer surfaces 10, 11 separately; in step S4, as shown in portion (B) of FIG. 7, the conductive wire 5' is further trimmed to form a second conductive terminal 2" and a remained conductive wire 5" after trimming, followed by, as shown in FIG. 8, causing the second conductive terminal 2" to pass through the connector body 1 via the second rectangular through-hole 15", as shown in FIGS. 9 to 10, to be exposed to the first, second outer surfaces 10, 11. As such, the first welding pad 20 used to weld the sensor element 4 may be formed on the first outer surface 10, and the second welding pad 21 used to weld the circuit substrate 41 may be formed on the second outer surface 11 for the first, second conductive terminals 2', 2".

Figure 11:
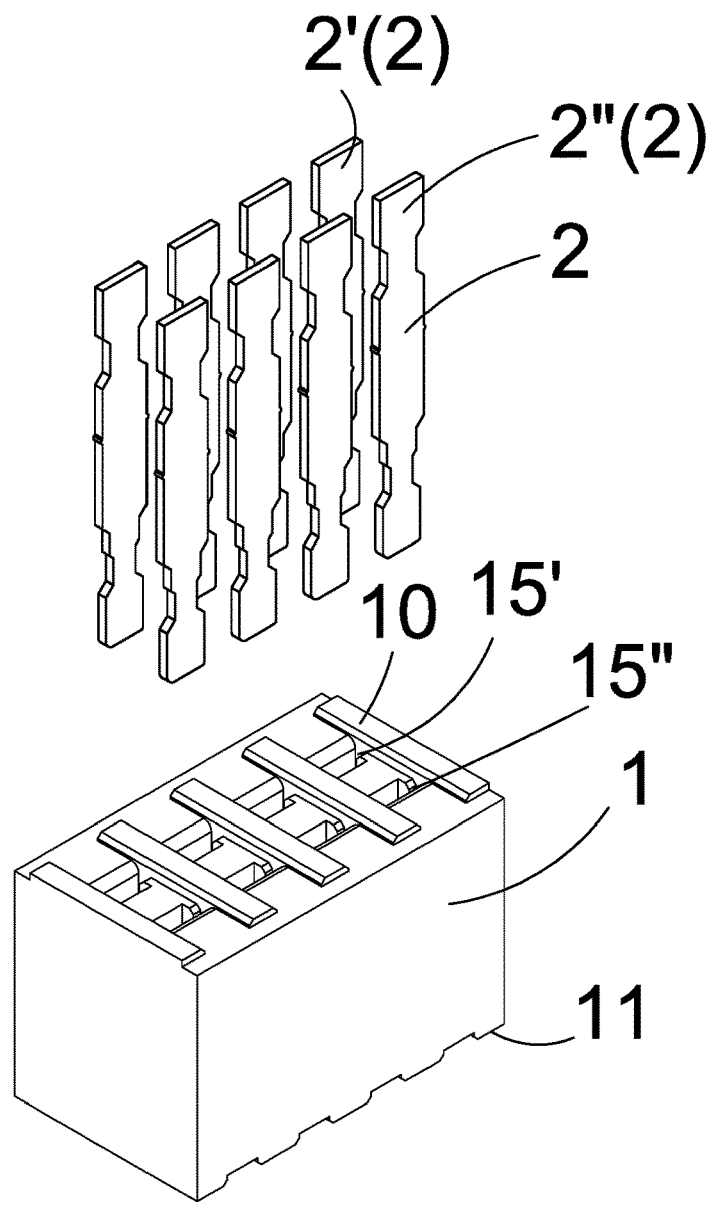
FIG. 11 is an exploded view of members showing a third example of an altitude increasing connector according to the invention.
Figure 12:
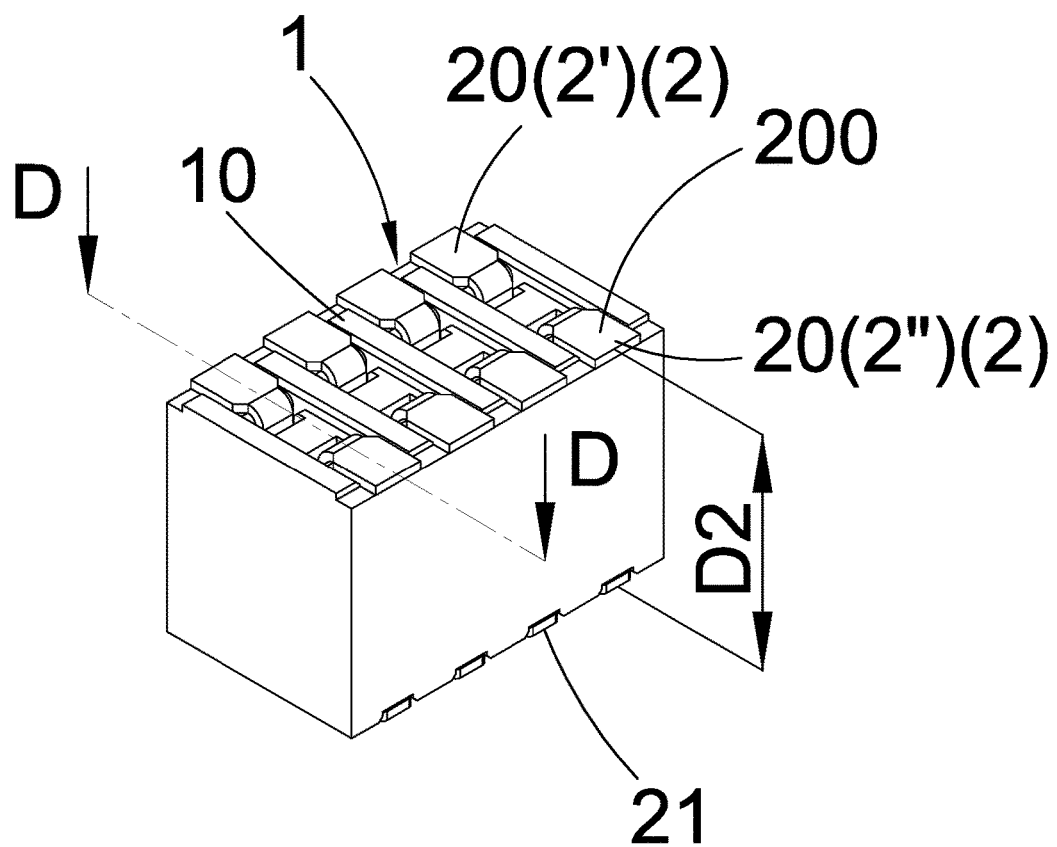
FIG. 12 is an assembly view of members showing the third example of the altitude increasing connector according to the invention.
Figure 13:
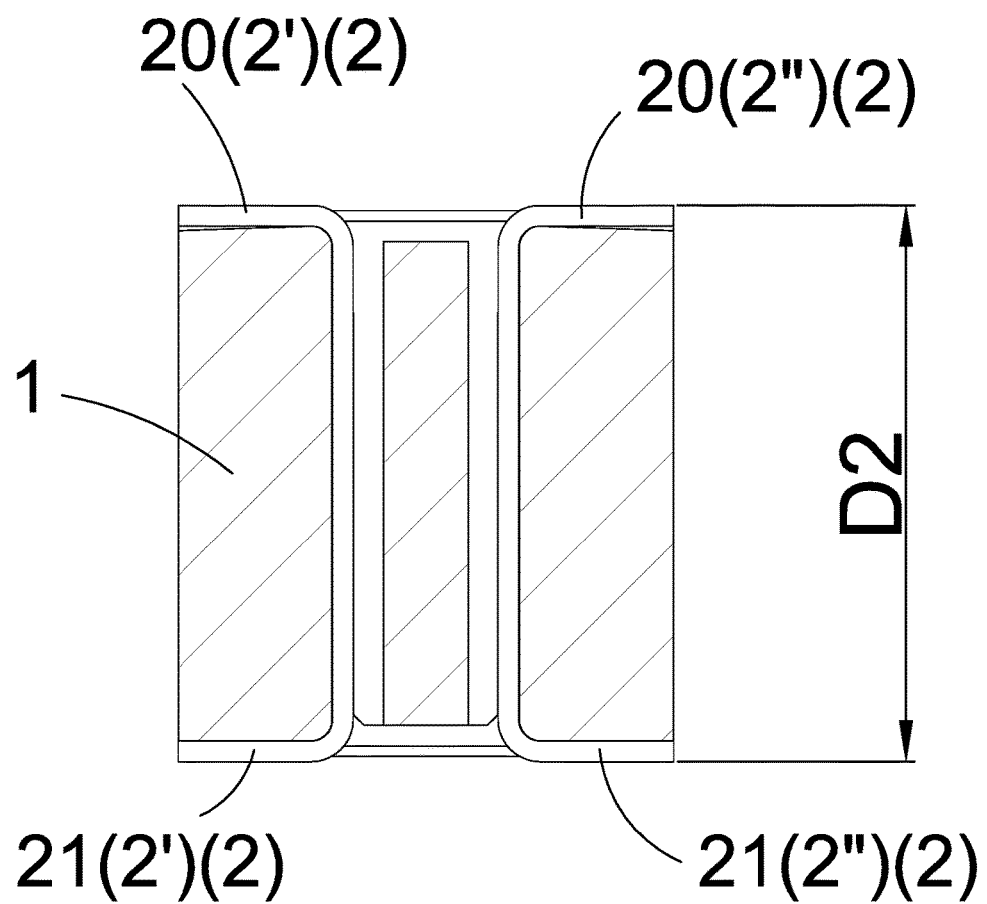
FIG. 13 is a sectional view showing the altitude increasing connector shown in FIG. 12 taken along line DD.

It is also noted that, as shown in FIGS. 1 to 4, each of the first, second welding pads 20, 21 is formed through a bend operation before the first, second conductive terminals 2', 2" are embedded in the connector body 1. That is, the first, second conductive terminals 2', 2" have been formed through bend before the connector body 1 is formed. However, it is not limited thereto. As shown in FIGS. 11 to 13, optionally, each of the first, second welding pads 20, 21 may also be formed through a bend operation after the first, second conductive terminals 2', 2" pass through the connector body 1 via the first, second rectangular through-holes 15', 15" separately.

In summary, the invention provides an altitude increasing connector and the method for manufacturing the same. The provided altitude increasing connector may be used for electrical connections of sensor elements and a circuit substrate inside a portable electronic device, may include a connector body and a plurality of conductive terminals, each of which passes through the connector body separately, and has a first welding pad and a second welding pad, wherein the first welding pad is used for welding the sensor element, the second welding pad is used for welding the circuit substrate, a distance between welding surfaces of both the first, second welding pads is fixed, such that a relative distance between electrical joints of both the sensor element and the circuit substrate is fixed, in order for adjusting a disposition altitude of the sensor element to an appropriate value by one process, so that not only manufacturing process efficient is improved, but also error accumulation may be avoided, and further, yield of the portable electronic device is increased.

What is claimed is:

1. A portable electronic device, comprising:
   a housing shell with an accommodation space;

a sensor element disposed inside the accommodation space;

a circuit substrate disposed inside the accommodation space;

an altitude increasing connector electrically connected to the sensor element and the circuit substrate, such that a relative distance between electrical joints of both the sensor element and the circuit substrate is fixed to a first distance, the altitude increasing connector including:

a connector body respectively having a first outer surface corresponding to the sensor element, and a second outer surface corresponding to the circuit substrate, wherein the first, second outer surfaces are two outer surfaces opposite to each other; and a plurality of conductive terminals, which pass through the connector body separately, and are formed with a first welding pad and a second welding pad separately; the first, second welding pads of each of the plurality of conductive terminals being formed through bend separately, and being exposed to the first, second outer surfaces separately, in order for welding the sensor element and the circuit substrate separately, wherein the connector body is against each of the plurality of the conductive terminals to keep a distance between the first welding pad and the second welding pad, so that an altitude position of the sensor element is increased to a first distance, and a position of the sensor element in the accommodation space is thus close to the housing shell to provide necessary functions.

2. The portable electronic device according to claim 1, wherein the plurality of conductive terminals are arranged in two symmetric rows, a left and a right rows.

3. The portable electronic device according to claim 2, wherein the plurality of conductive terminals which are arranged in the left row are bent in a first direction, the plurality of conductive terminals which are arranged in the right row are bent in a second direction, the first, second directions being two opposite directions.

4. The portable electronic device according to claim 2, wherein the connector body is an insulator.

5. The portable electronic device according to claim 1, wherein each of the plurality of conductive terminals is formed by bending a sheet metal integrally.

6. The portable electronic device according to claim 1, wherein each of the first, second welding pads is protruded out of the first, second outer surfaces of the connector body separately.

7. The portable electronic device according to claim 1, wherein each of the plurality of conductive terminals is bent continuously to form an approximate inverted U shape.

8. The portable electronic device according to claim 1, wherein the connector body has a plurality of locating slots, each of which is used to locate the plurality of conductive terminals in forming the connector body.

9. The portable electronic device according to claim 8, wherein at least two of the locating slots have vertically orthogonal relationship.

10. The portable electronic device according to claim 1, wherein the sensor element is a light sensor element or an acoustic sensor element.

* * * * *